(12) United States Patent
Tang et al.

(10) Patent No.: US 8,491,986 B2
(45) Date of Patent: Jul. 23, 2013

(54) PANEL MODULE AND MANUFACTURING METHOD THEREOF

(75) Inventors: Pao-Yun Tang, Taoyuan County (TW); Wei-Hao Sun, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 105 days.

(21) Appl. No.: 13/115,316

(22) Filed: May 25, 2011

(65) Prior Publication Data

US 2012/0301678 A1    Nov. 29, 2012

(51) Int. Cl.
*B32B 3/00* (2006.01)
*B32B 27/14* (2006.01)
*B32B 7/14* (2006.01)

(52) U.S. Cl.
USPC .................. 428/166; 428/198; 428/201

(58) Field of Classification Search
USPC ........ 428/198, 166, 201; 345/173; 178/18.03, 178/18.09, 18.04, 18.05, 18.06, 18.07, 18.08
See application file for complete search history.

(56) References Cited

U.S. PATENT DOCUMENTS 6,559,902 B1 * 5/2003 Kusuda et al. .................. 349/12
2009/0102808 A1 * 4/2009 Huang et al. .................. 345/173

* cited by examiner

*Primary Examiner* — Catherine A Simone
(74) *Attorney, Agent, or Firm* — Birch, Stewart, Kolasch & Birch, LLP

(57) ABSTRACT

A panel module is provided, including a first substrate, a second substrate, a first optical glue, and a second optical glue. The first and second optical glues are disposed between the first and second substrates, wherein the first optical glue protrudes from the first substrate, and the second optical glue adheres the first substrate to the second substrate. Specifically, the viscosity of the second optical glue is smaller than the first optical glue before solidification.

35 Claims, 5 Drawing Sheets

PANEL MODULE AND MANUFACTURING METHOD THEREOF

BACKGROUND OF THE INVENTION

1. Field of the Invention

This application relates in general to a panel module and in particular to a panel module with two substrates having a constant distance therebetween.

2. Description of the Related Art

Referring to FIGS. 1A and 1B, a conventional touch panel usually comprises a first substrate 11 and a second substrate 12. During assembly, an LOCA 13 (liquid optical clear glue) is disposed between the first and second substrates 11 and 12 and cured by UV light, so as to firmly connect the first substrate 11 with the second substrate 12.

However, since the LOCA 13 can flow and form an uneven surface, an air gap 131 may be formed between the first and second substrates 11 and 12. Thus, bending and deformation of the first and second substrates 11 and 12 may occur and lead to a non-uniform distance therebetween. Generally, the distance between the first and second substrates 11 and 12 near the center thereof is smaller than that near the edge thereof. In practical applications, such as in the production of 3.5 inches touch panels, the variation of the distance may exceed 30%.

In capacitive touch panels, non-uniform distances between the first and second substrates 11 and 12 can adversely affect accuracy of capacitance sensing. For the reasons described above, the task of preventing non-uniform distances from occurring between the first and second substrates during assembly, has become a challenge.

BRIEF SUMMARY OF INVENTION

An embodiment of the invention provides a panel module including a first substrate, a second substrate, a first optical glue, and a second optical glue. The first and second optical glues are disposed between the first and second substrates, wherein the first optical glue protrudes from the first substrate, and the second optical glue adheres the first substrate to the second substrate. Specifically, the viscosity of the second optical glue is smaller than the first optical glue before solidification.

Additionally, an embodiment of the invention provides a method for manufacturing a panel module, comprising the steps of: disposing a first optical glue on a first substrate, wherein the first optical glue is located near a center of the panel module and protrudes from the first substrate; solidifying the first optical glue; disposing a second optical glue on a first substrate; disposing a second substrate on the first substrate; and solidifying the second optical glue to adhere the second substrate to the first substrate.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
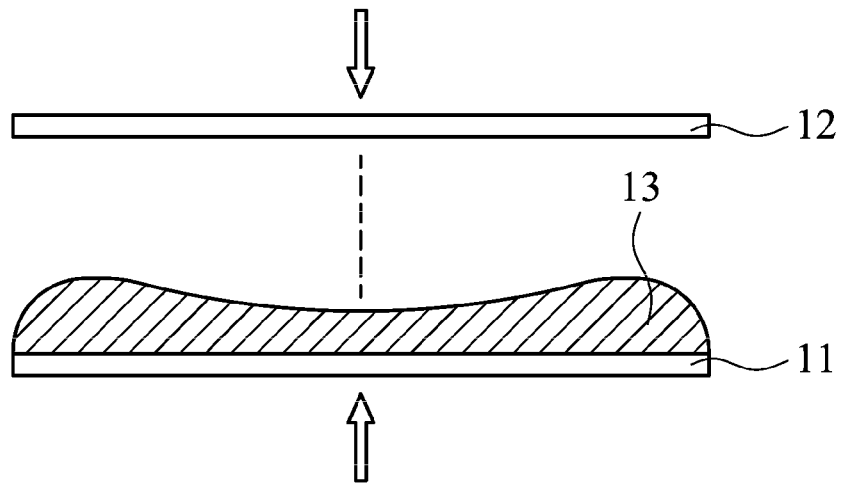
FIGS. 1A and 1B are perspective diagrams of a conventional panel module having two substrates connected to each other by an optical glue.
Figure 1B:
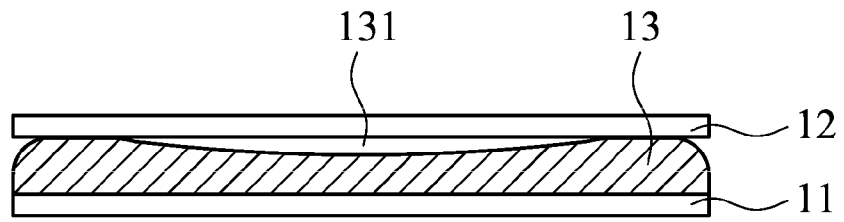
Figure 2:
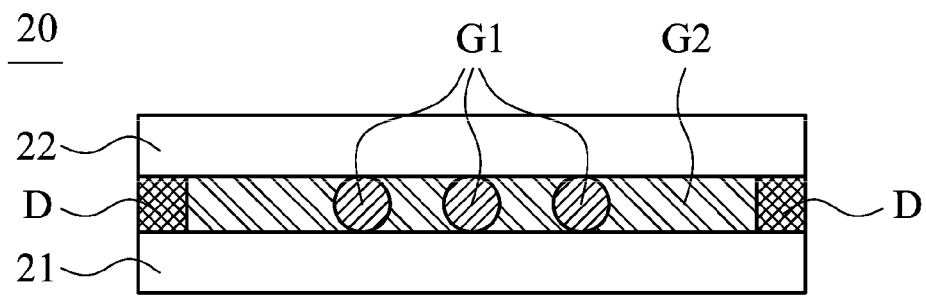
FIG. 2 is a sectional view of a panel module according to an embodiment of the invention.

Referring to FIG. 2, an embodiment of a panel module 20 may be a touch panel module of an electronic device. The panel module 20 primarily comprises a first substrate 21 and a second substrate 22. Specifically, at least a first optical glue G1, a second optical glue G2, and at least a dam D are disposed between the first and second substrates 21 and 22. In this embodiment, the first optical glue G1, the second optical glue G2, and the dam D may comprise UV curable material, wherein the viscosity of the first optical glue G1 and the dam D is from 10000 to 40000 cps/25° C. before solidification, and the viscosity of the second optical glue G2 is from 1000 to 3000 cps/25° C. before solidification. Namely, the viscosity of the second optical glue G2 is substantially smaller than that of the first optical glue G1 and the dam D before solidification.

During assembly of the panel module 20, first, a plurality of first optical glues G1 and the dam D are disposed on the first substrate 21. After the first optical glues G1 and the dam D are solidified, the second optical glue G2 is disposed on the first substrate 21. Subsequently, the second optical glue G2 is solidified to firmly connect the first and second substrates 21 and 22 together.

In this embodiment, the dam D and the first and second optical glues G1 and G2 can be cured by UV light, wherein the heights of the first optical glue G1 and the dam D are substantially the same. Since the second optical glue G2 can be filled into the gaps between the first optical glues G1 and the dam D, the first and second substrates 21 and 22 are firmly connected. As shown in FIG. 2, each of the first optical glues G1 has a round structure contacting with the first and second substrates 21 and 22. It is noted that the first optical glues G1 are spaced apart from each other, to suppress the second optical glue G2 from flowing on the first substrate 21. Thus, bending or deformation of the first and second substrates 21 and 22 can be prevented during assembly, so as to ensure quality of the panel module 20.

Figure 3:
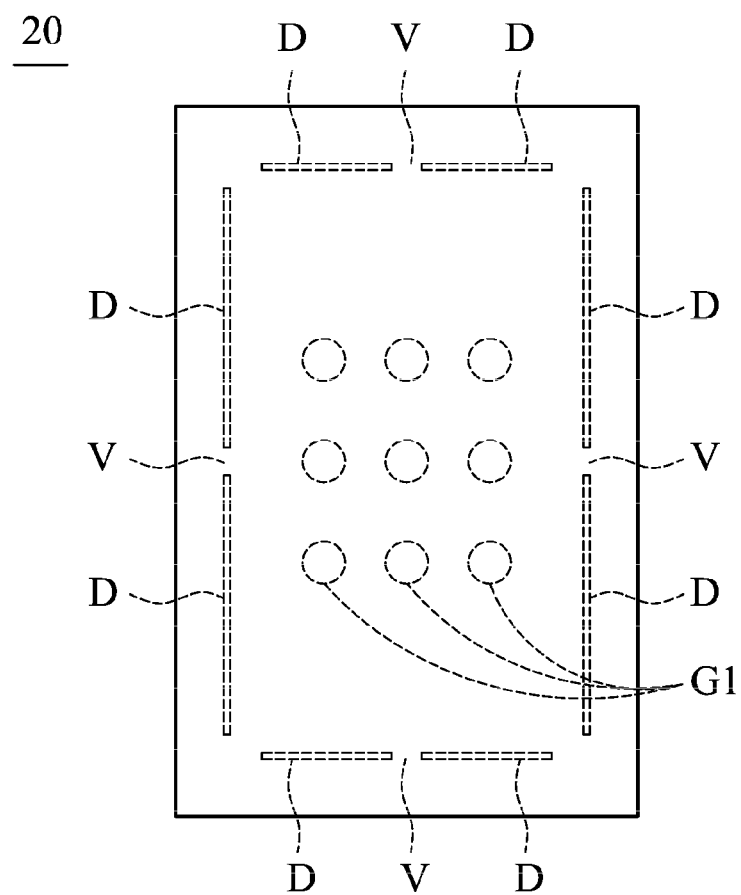
FIG. 3 is a top view a panel module according to another embodiment of the invention.

Referring to FIG. 3, the first optical glues G1 can be disposed near a center of the panel module 20, arranged in a dot matrix pattern, and surrounded by the dams D. In this embodiment, the dams D are substantially longitudinal and near the edges of the panel module 20. As shown in FIG. 3, the adjacent dams D form a vent hole V therebetween for discharging the second optical glue G2 before solidification.

Figure 4:
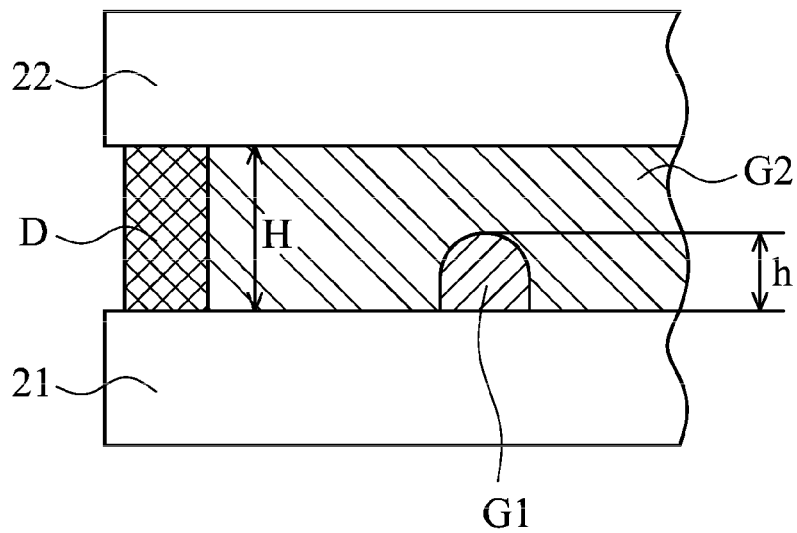
FIG. 4 is a sectional view of a panel module according to another embodiment of the invention.

Referring to FIG. 4, the first optical glue G1 protrudes from the first substrate 21, but does not contact the second substrate 22. In this configuration, the first and second substrates 21 and 22 are structurally supported by the dam D and spaced apart from each other at a distance, wherein the first optical glue G1 is encompassed by the second optical glue G2. As shown in FIG. 4, the height h of the first optical glue G1 is smaller than the height H of the second optical glue G2. Since the first optical glue G1 protrudes from the first substrate 21, the flow of the second optical glue G2 on the first substrate 21 can be suppressed, so as to prevent bending or deformation of the first and second substrates 21 and 22 and ensure quality of the panel module 20.

Figure 5:
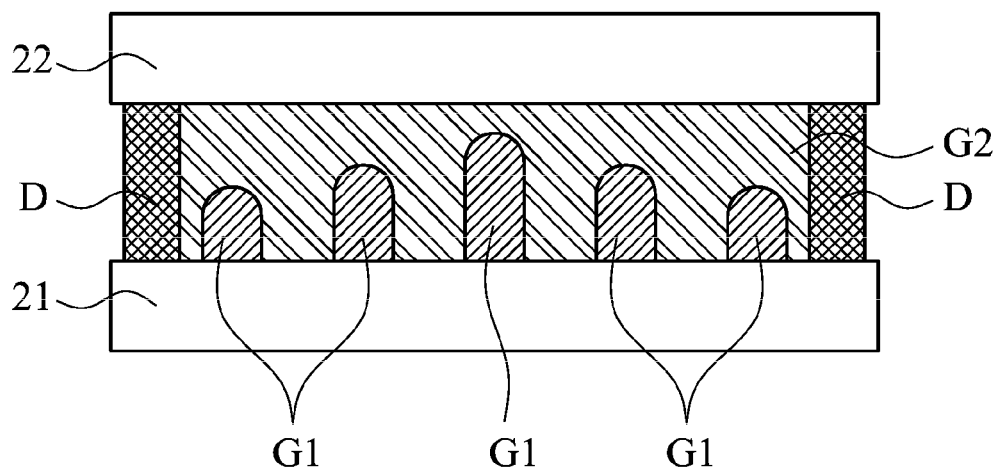
FIG. 5 is a sectional view of a panel module according to another embodiment of the invention.

In some embodiments, the first optical glues G1 may form a plurality of protruding structures with different heights on the first substrate 21, as shown in FIG. 5, wherein the protruding structures decrease progressively from the center to the edges of the panel module 20. Since the viscosity of the second optical glue G2 is smaller than that of the first optical glue G1 before solidification, the protruding structures of the first optical glues G1 can suppress the second optical glue G2 from flowing on the first substrate 21, so as to prevent bending or deformation of the first and second substrates 21 and 22.

Figure 6:
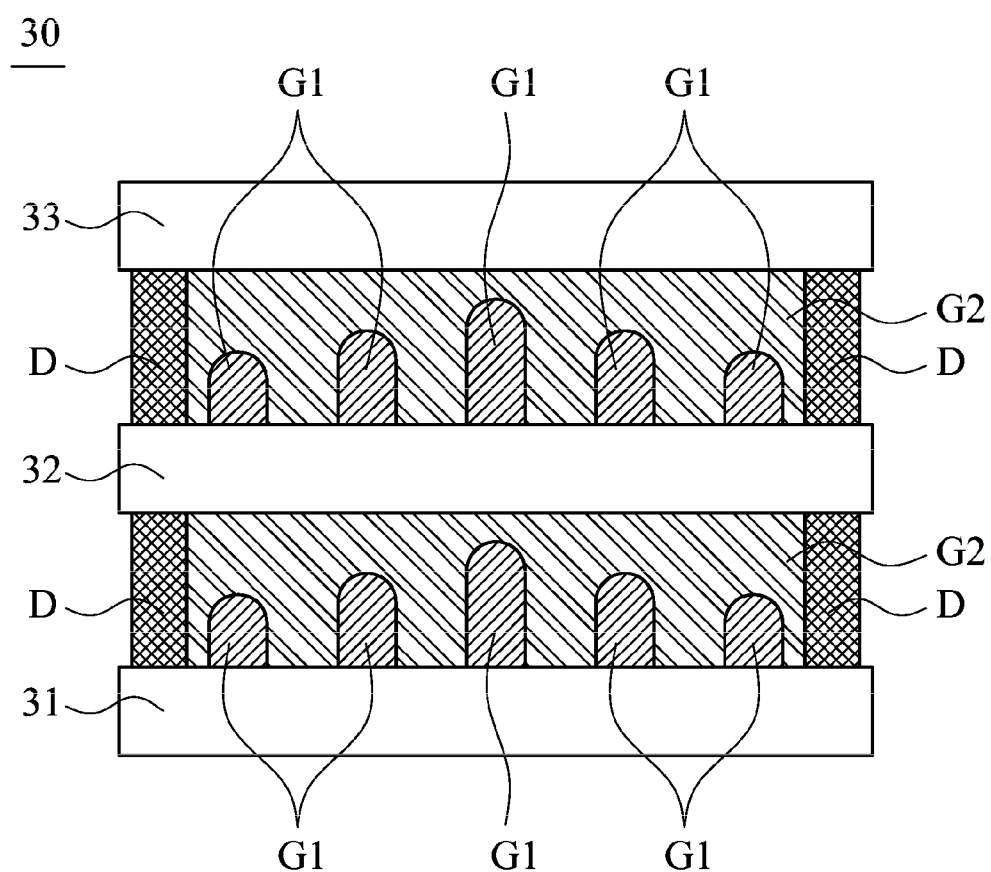
FIG. 6 is a sectional view of a panel module according to another embodiment of the invention.

Referring to FIG. 6, another embodiment of a panel module 30 is a multi-layer touch panel module, comprising a first substrate 31, a second substrate 32, and a third substrate 33. As shown in FIG. 6, the dams D are disposed between first, second, and third substrates 31, 32, and 33. Specifically, the first optical glues G1 form a plurality of protruding structures on the first and second substrates 31 and 32, wherein the heights of the protruding structures can be the same or different. When the first optical glues G1 are solidified, the second optical glue G2 can be filled into the space between the first, second, and third substrates 31, 32, and 33, so as to firmly connect the first substrate 31 with the second substrate 32.

Figure 9:
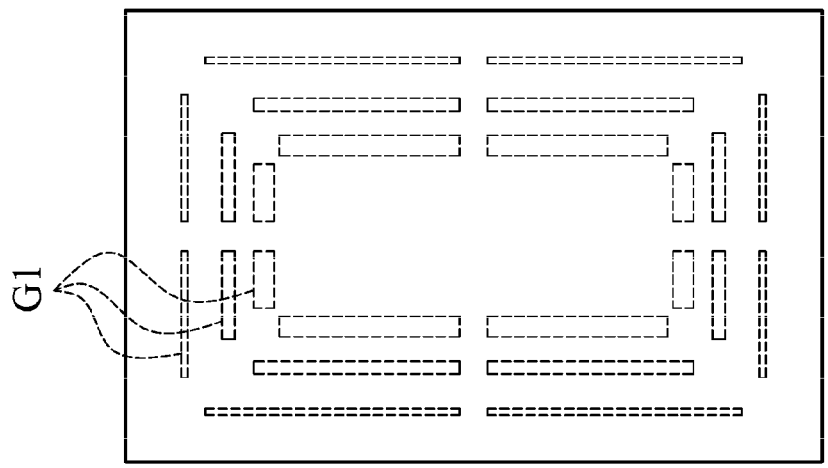
FIG. 9 is a top view of a panel module according to another embodiment of the invention.
Figure 8:
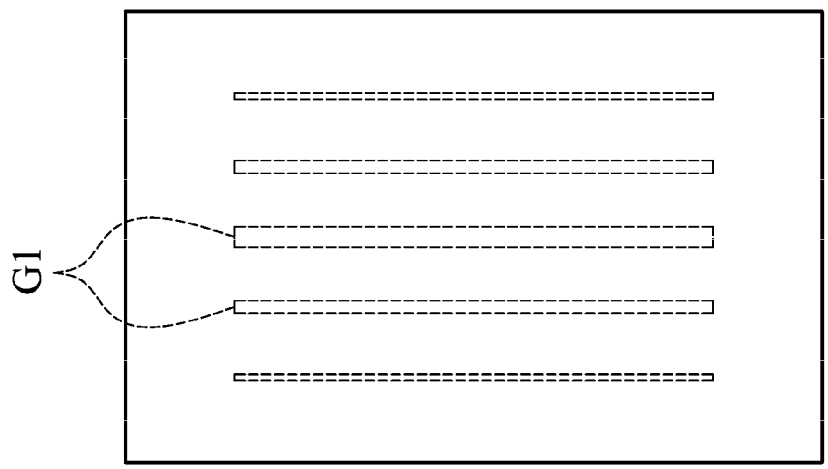
FIG. 8 is a top view of a panel module according to another embodiment of the invention.
Figure 7:
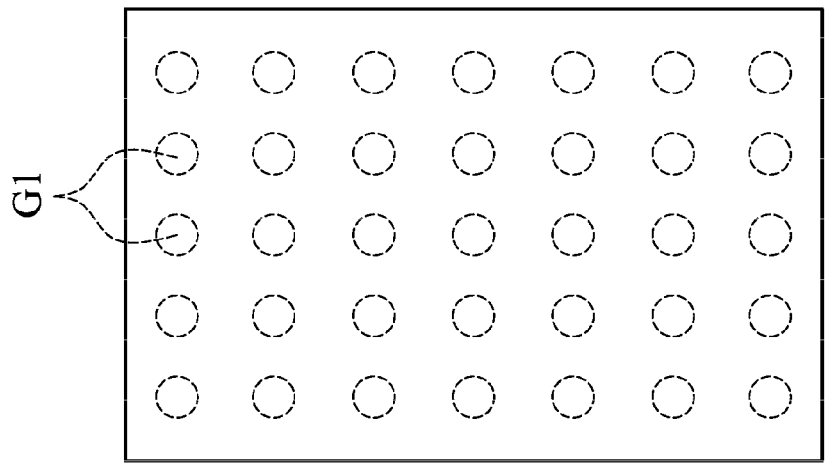
FIG. 7 is a top view of a panel module according to another embodiment of the invention.

Referring to FIGS. 7-9, the first optical glues G1 can be disposed near a center of the panel module 20 and arranged to form various patterns on the first substrate 21. As shown in FIG. 7, the first optical glues G1 are neatly and uniformly arranged in a dot matrix pattern. As shown in FIG. 8, the first optical glues G1 are substantially longitudinal and arranged in parallel, wherein the widths of the first optical glues G1 may be the same or different. As shown in FIG. 9, the first optical glues G1 are substantially longitudinal and arranged to form a maze structure in the panel module.

The invention provides a panel module including a first substrate and a second substrate with a first optical glue and a second optical glue disposed therebetween. In some embodiments, a plurality of first optical glues is arranged in a dot matrix pattern on the first substrate, and the second optical glue is applied to firmly connect the first substrate with the second substrate. Specifically, the viscosity of the second optical glue is smaller than that of the first optical glue before solidification. Thus, bending or deformation of the first and second substrates can be prevented during assembly, so as to keep a constant distance therebetween and ensure quality of the panel module.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A panel module, comprising:
   a first substrate;
   a second substrate;
   a first optical glue, disposed on the first substrate and between the first and second substrates, wherein the first optical glue protrudes from the first substrate and is located near a center of the panel module; and
   a second optical glue, disposed between the first and second substrates for adhering the first substrate to the second substrate, wherein the viscosity of the first optical glue is from 10000 to 40000 cps/25° C. before solidification.

2. The panel module as claimed in claim 1, wherein the viscosity of the second optical glue is smaller than that of the first optical glue before solidification.

3. The panel module as claimed in claim 1, wherein the panel module further comprises a plurality of first optical glues arranged in a dot matrix pattern on the first substrate.

4. The panel module as claimed in claim 1, wherein the panel module further comprises a plurality of first optical glues with different heights.

5. The panel module as claimed in claim 4, wherein the heights of the first optical glues decrease progressively from the center to an edge of the panel module.

6. The panel module as claimed in claim 1, wherein the first and second optical glues comprise UV curable material.

7. The panel module as claimed in claim 1, wherein the panel module further comprises a plurality of dams connecting the first and second substrates together to form a specific distance therebetween.

8. The panel module as claimed in claim 7, wherein the dams are substantially longitudinal and surround the first optical glue, and the adjacent dams form a vent hole therebetween.

9. The panel module as claimed in claim 7, wherein the dams comprise UV curable material.

10. The panel module as claimed in claim 1, wherein the panel module further comprises a plurality of first optical glues, and the first optical glues are substantially longitudinal and parallel to each other on the first substrate.

11. The panel module as claimed in claim 1, wherein the panel module further comprises a plurality of first optical glues, and the first optical glues are substantially longitudinal and form a maze structure on the first substrate.

12. The panel module as claimed in claim 1, wherein the panel module further comprises a plurality of first optical glues, and the first optical glues are substantially longitudinal with different widths.

13. The panel module as claimed in claim 1, wherein the first optical glue contacts between the first and second substrates.

14. The panel module as claimed in claim 1, wherein first optical glue is encompassed by the second optical glue.

15. A method for manufacturing a panel module, comprising:
   providing a first substrate;
   disposing a first optical glue on the first substrate, wherein the first optical glue is located near a center of the panel module and protrudes from the first substrate;
   disposing a second optical glue on the first substrate; and
   providing a second substrate and disposing the second substrate on the first substrate,
   wherein the viscosity of the first optical glue is from 10000 to 40000 cps/25° C. before solidification.

16. The method as claimed in claim 15, wherein the viscosity of the second optical glue is smaller than that of the first optical glue before solidification.

17. The method as claimed in claim 16, wherein the method further comprises:
   disposing a plurality of first optical glues on the first substrate, wherein the first optical glues are arranged in a dot matrix pattern.

18. The method as claimed in claim 16, wherein the method further comprises:

disposing a plurality of first optical glues on the first substrate, wherein the heights of the first optical glues are different.

19. The method as claimed in claim 18, wherein the method further comprises:
disposing a plurality of first optical glues on the first substrate, wherein the heights of the first optical glues decrease progressively from the center to an edge of the panel module.

20. The method as claimed in claim 15, wherein the first and second optical glues comprise UV curable material.

21. The method as claimed in claim 15, wherein the method further comprises:
forming a plurality of dams on the first substrate, wherein the dams connect the first and second substrates together to form a specific distance therebetween.

22. The method as claimed in claim 21, wherein the dams are substantially longitudinal and surround the first optical glue, and the adjacent dams form a vent hole therebetween.

23. The method as claimed in claim 21, wherein the dams comprise UV curable material.

24. The method as claimed in claim 15, wherein the method further comprises:
disposing a plurality of first optical glues on the first substrate, wherein the first optical glues are substantially longitudinal and parallel to each other.

25. The method as claimed in claim 15, wherein the method further comprises:
disposing a plurality of first optical glues on the first substrate, wherein the first optical glues are substantially longitudinal and form a maze structure.

26. The method as claimed in claim 15, wherein the method further comprises:
disposing a plurality of first optical glues on the first substrate, wherein the first optical glues are substantially longitudinal with different widths.

27. The method as claimed in claim 15, wherein the first optical glue contacts between the first and second substrates.

28. The method as claimed in claim 15, wherein first optical glue is encompassed by the second optical glue.

29. The method as claimed in claim 15, wherein the method further comprises:
solidifying the first optical glue.

30. The method as claimed in claim 15, wherein the method further comprises:
solidifying the second optical glue to adhere the second substrate to the first substrate.

31. A panel module, comprising:
a first substrate;
a second substrate;
a first optical glue, disposed on the first substrate and between the first and second substrates, wherein the first optical glue protrudes from the first substrate and is located near a center of the panel module; and
a second optical glue, disposed between the first and second substrates for adhering the first substrate to the second substrate, wherein the viscosity of the second optical glue is from 1000 to 3000 cps/25° C. before solidification.

32. A panel module, comprising:
a first substrate;
a second substrate;
a first optical glue, disposed on the first substrate and between the first and second substrates, wherein the first optical glue protrudes from the first substrate and is located near a center of the panel module;
a second optical glue, disposed between the first and second substrates for adhering the first substrate to the second substrate; and
a plurality of dams connecting the first and second substrates together to form a specific distance therebetween, wherein the viscosity of the dams is from 10000 to 40000 cps/25° C. before solidification.

33. A method for manufacturing a panel module, comprising:
providing a first substrate;
disposing a first optical glue on the first substrate, wherein the first optical glue is located near a center of the panel module and protrudes from the first substrate;
disposing a second optical glue on the first substrate; and
providing a second substrate and disposing the second substrate on the first substrate, wherein the viscosity of the second optical glue is from 1000 to 3000 cps/25° C. before solidification.

34. A method for manufacturing a panel module, comprising:
providing a first substrate;
disposing a first optical glue on the first substrate, wherein the first optical glue is located near a center of the panel module and protrudes from the first substrate;
disposing a second optical glue on the first substrate;
providing a second substrate and disposing the second substrate on the first substrate; and
forming a plurality of dams on the first substrate, wherein the dams connect the first and second substrates together to form a specific distance therebetween, and the viscosity of the dams is from 10000 to 40000 cps/25° C. before solidification.

35. A panel module, comprising:
a first substrate;
a second substrate;
a plurality of first optical glues with different heights, disposed on the first substrate and between the first and second substrates, wherein the first optical glues protrude from the first substrate and the heights of the first optical glues decrease progressively from the center to an edge of the panel module; and
a second optical glue, disposed between the first and second substrates for adhering the first substrate to the second substrate.

* * * * *